US010672693B2

(12) United States Patent
Ganesan et al.

(10) Patent No.: US 10,672,693 B2
(45) Date of Patent: Jun. 2, 2020

(54) INTEGRATED CIRCUIT STRUCTURES IN PACKAGE SUBSTRATES

(71) Applicant: INTEL CORPORATION, Santa Clara, CA (US)

(72) Inventors: Sanka Ganesan, Chandler, AZ (US); William James Lambert, Chandler, AZ (US); Zhichao Zhang, Chandler, AZ (US); Sri Chaitra Jyotsna Chavali, Chandler, AZ (US); Stephen Andrew Smith, Laveen, AZ (US); Michael James Hill, Gilbert, AZ (US); Zhenguo Jiang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/944,728

(22) Filed: Apr. 3, 2018

(65) Prior Publication Data

US 2019/0304887 A1    Oct. 3, 2019

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4832* (2013.01); *H01L 21/4853* (2013.01); *H01L 21/568* (2013.01); *H01L 23/3107* (2013.01); *H01L 24/73* (2013.01); *H01L 25/0657* (2013.01); *H01L 25/105* (2013.01); *H05K 1/181* (2013.01); *H05K 7/023* (2013.01)

(58) Field of Classification Search
CPC ........... H01L 23/49816; H01L 21/4832; H01L 21/4853; H01L 21/568
See application file for complete search history.

(56) References Cited

U.S. PATENT DOCUMENTS

2008/0012663 A1    1/2008  Chung et al.
2009/0260228 A1*  10/2009  Val .................... H01L 21/561
                                                        29/830
(Continued)

FOREIGN PATENT DOCUMENTS

CN      107924998 A    4/2018
TW      201732845 A    9/2017
(Continued)

OTHER PUBLICATIONS

Athanasopoulos, N., et al., "Design and Development of 60 GHz Millimeter-wave Passive Components using Substrate Integrated Waveguide Technology," Conference Paper, 2nd Pan-Hellenic Conference on Electronics and Telecommunications, PACET'12, Mar. 2012; 5 pages.
Bozzi, M., et al., "Review of substrate-integrated waveguide circuits and antennas," IET Microwaves, Antennas & Propagation, Sep. 15, 2010, 12 pages.
Dong, Jun, et al., "Broadband Millimeter-Wave Power Combiner Using Compact SIW to Waveguide Transition," IEEE Microwave and Wireless Components Letters, vol. 25, No. 9, Sep. 2015; 3 pages.
(Continued)

*Primary Examiner* — Elias Ullah
(74) *Attorney, Agent, or Firm* — Patent Capital Group

(57) ABSTRACT

Disclosed herein are integrated circuit (IC) structures that may be included in package substrates. For example, disclosed herein are passive components in package substrate, wherein the passive components include at least one non-circular via and at least one pad in contact with the at least one non-circular via, and the passive components include an inductor or a capacitor. Other embodiments are also disclosed.

21 Claims, 7 Drawing Sheets

(51) Int. Cl.
*H01L 23/00* (2006.01)
*H01L 23/31* (2006.01)
*H05K 1/18* (2006.01)
*H01L 25/10* (2006.01)
*H01L 25/065* (2006.01)
*H05K 7/02* (2006.01)
*H01L 21/56* (2006.01)

(56) References Cited

U.S. PATENT DOCUMENTS

| | | | |
|---|---|---|---|
| 2010/0148337 A1* | 6/2010 | Liu | H01L 21/4814 257/686 |
| 2013/0043557 A1 | 2/2013 | Cho | |
| 2013/0319738 A1 | 12/2013 | Hurwitz et al. | |
| 2014/0197545 A1* | 7/2014 | Chase | H05K 1/0222 257/774 |
| 2015/0371936 A1* | 12/2015 | Chen | H01L 23/5384 257/774 |
| 2017/0092412 A1 | 3/2017 | Manusharow et al. | |

FOREIGN PATENT DOCUMENTS

| | | |
|---|---|---|
| WO | 2017052647 A1 | 3/2017 |
| WO | 2017052813 A1 | 3/2017 |
| WO | 2017111910 A1 | 6/2017 |

OTHER PUBLICATIONS

Kumar, Hemendra, et al., "A Review on Substrate Integrated Waveguide and its Microstrip Interconnect," IOSR Journal of Electronics and Communication Engineering (IOSR-JECE), ISSN: 2278-2834, ISBN: 2278-8735. vol. 3, Issue 5, (Sep.-Oct. 2012), pp. 36-40.

Rhbanou, Ahmed, et al., "Design of Substrate Integerated Waveguide Bandpass Filter Based on Metamaterials CSRRs," Electrical and Electronic Engineering 2014, 4(4): 63-72.

PCT Jun. 11, 2019 International Search Report and Written Opinion from PCT/US2019/020275; 10 pages.

* cited by examiner

INTEGRATED CIRCUIT STRUCTURES IN PACKAGE SUBSTRATES

BACKGROUND

In integrated circuit devices, conductive pathways through a device often include conductive vias that electrically couple conductive lines in two different layers of the device. These conductive vias are typically formed by drilling a circular hole through a dielectric material, and then filling that hole with a conductive material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 2:
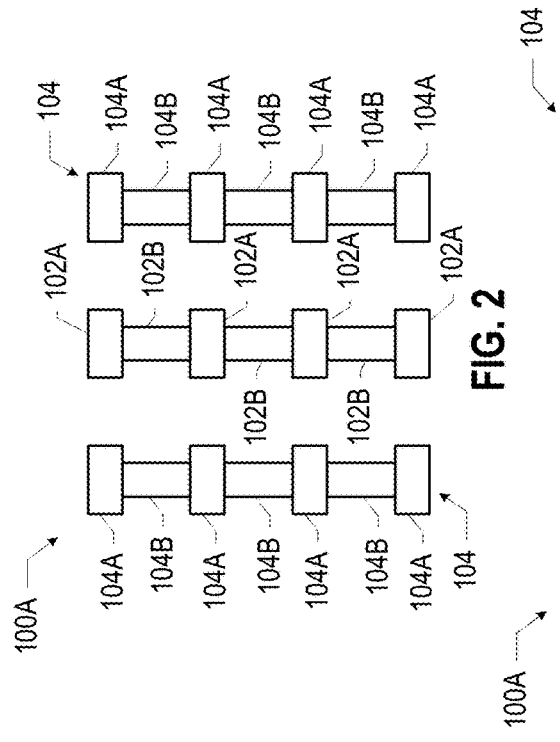
FIGS. 1A-1B and 2-3 are various views of examples of vertical shielded interconnects, in accordance with various embodiments.

Disclosed herein are integrated circuit (IC) structures that may be included in package substrates. For example, disclosed herein are passive components in package substrate, wherein the passive components include at least one non-circular via and at least one pad in contact with the at least one non-circular via, and the passive components include an inductor or a capacitor. Other embodiments are also disclosed.

In conventional package substrates, conductive pathways are provided by conductive lines (extending laterally in a metal layer in the package substrate) and conductive vias (extending vertically between metal layers). Conductive vias are conventionally formed by drilling a circular hole in a dielectric material, and then filling that circular hole with a metal. Such vias are typically formed one at a time, and are constrained to have a circular footprint. Moreover, such vias are limited in how small they may be made; for example, the minimum width of a laser-drilled via will always be greater than the width of the laser drill.

Disclosed herein are integrated circuit (IC) structures that may include patterned vias formed by techniques other than drilling. Such patterned vias (e.g., rectangular, triangular, oblong, circular, curved, etc.) may be formed by lithographic techniques, and may be manufactured efficiently and accurately. The IC structures disclosed herein may include interconnect structures, passive devices, and other elements, expanding the range of uses for patterned vias and improving digital performance, radio frequency (RF) performance, and/or power delivery in IC assemblies (e.g., by reducing losses).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, and the phrase "FIG. 8" may be used to refer to the collection of drawings of FIGS. 8A-8C.

Various IC structures 100 are disclosed herein, including vertical shielded interconnects 100A, horizontal shielded interconnects 100B, waveguides 100C, capacitors 100D, inductors 100E, antenna structures 100F, and package substrate shield structures 100G. Any of these IC structures may be included in any suitable portion of an IC assembly. For example, any of the IC structures 100 disclosed herein may be included in a package substrate 1652 of an IC package 1650 (discussed below). The IC structures 100 disclosed herein may be used in digital signaling, RF signaling, and/or power delivery devices (e.g., power management integrated circuits), among other examples.

The various IC structures 100 disclosed herein may include pads and vias, with the vias coupling pads in different layers of an IC component (e.g., a coreless package substrate). The pads and vias may be formed of any suitable conductive material, such as copper. For example, the pads and/or vias may be formed of one or more metals (e.g., metal alloys). The pads and vias may be surrounded by one or more dielectric materials (not shown in most figures for ease of illustration); such dielectric materials may include mold materials, laminates, spin-on dielectrics, or other suitable materials. In some embodiments, the pads disclosed herein may have a diameter or maximum linear dimension between 10 microns and 100 microns. In some embodiments, the vias disclosed herein may have a height between 5 microns and 100 microns.

The vias included in the IC structures 100 disclosed herein may be patterned vias. Patterned vias may have non-circular footprints of any suitable shape, unlike conventional circular vias formed by mechanical drilling or laser drilling. In some embodiments, patterned vias may be formed by lithographic processes. For example, a patterned via may be formed by laminating a photoresist (e.g., a dry film photoresist), patterning the photoresist to form the via openings, electroplating metal over the openings to form the vias, removing the photoresist, and laminating a dielectric material (e.g., a build-up film) over the vias, and then polishing back the build-up film to expose the vias. The pads may then be patterned on the vias. The techniques used to form patterned vias may be referred to as planarized substrate techniques, and may include self-aligned via (SAV) techniques, zero-misaligned via (ZMV) techniques, lithographic via (LiV) techniques, photoimageable dielectric (PID) techniques, bumpless, laser-less embedded substrate structure (BLESS) techniques, and molded interconnect substrate (MIS) techniques. Creating patterned vias by lithography may be faster, more accurate, and less expensive than creating patterned vias by arranging many drilled vias in overlapping proximity; such drilled via structures may also be rougher and limited in their possible configurations.

Figure 1A:
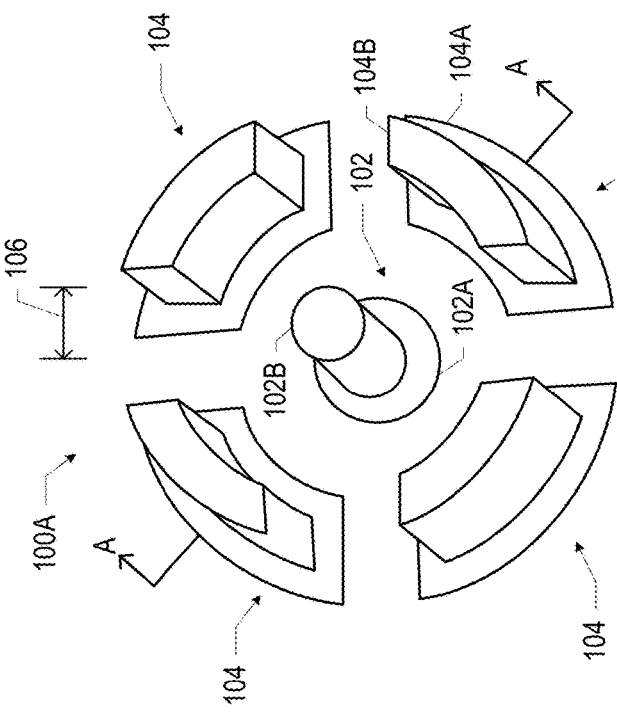
Figure 1B:
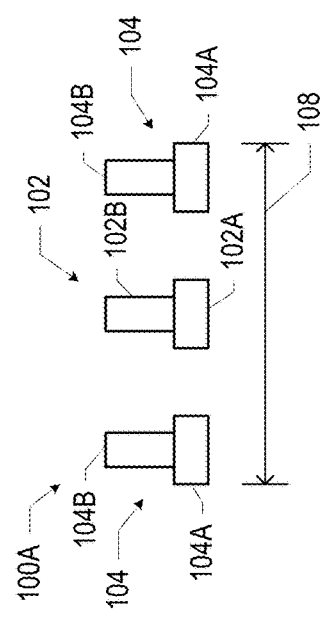

The IC structures 100 disclosed herein may include interconnects. For example, FIG. 1 illustrates a vertical shielded interconnect 100A, in accordance with various embodiments. In particular, FIG. 1A is a perspective view of a vertical shielded interconnect 100A, and FIG. 1B is a cross-sectional side view of the vertical shielded interconnect 100A of FIG. 1A (through the section A-A of FIG. 1A). The shielded interconnect 100A of FIG. 1 may include a signal portion 102 and multiple shield portions 104 distributed around, and spaced away from, the signal portion 102; the vertical shielded interconnect 100A of FIG. 1 (and the vertical shielded interconnect 100A of FIG. 2, discussed below) may thus be referred to as a "coaxial via." The signal portion 102 may include a pad 102A and a via 102B; the footprints of the pad 102A and the via 102B may be circular, as illustrated in FIG. 1, or may have another shape (e.g., a rectangular or triangular shape). The pad 102A may have a footprint that is larger than a footprint of the via 102B so that the via 102B "lands" on the pad 102A with margins to allow for misalignment. The via 102B may be a patterned via formed on the pad 102A.

The shield portions 104 may each include a pad 104A and a via 104B; the footprints of the pad 104A and the via 104B may each have an arcuate shape, as illustrated in FIG. 1, or may have another shape (e.g., an angle shape). The pad 104A may have a footprint that is larger than a footprint of the via 104B so that the via 104B "lands" on the pad 104A with margins to allow for misalignment. The via 104B may be a patterned via formed on the pad 104A. The shield portions 104 may be coupled to a ground line or plane, or another suitable reference. Although four shield portions 104 are illustrated in FIG. 1A, a vertical shielded interconnect 100A may include fewer than four shield portions 104 or more than four shield portions 104. For example, in some embodiments, a vertical shielded interconnect 100A may include two shield portions 104 (each having a half-circle arcuate shape), or three shield portions 104. In some embodiments, a vertical shielded interconnect 100A may have a single shield portion 104 (e.g., having a circular footprint), but vertical shielded interconnects 100A with multiple shield portions 104 may be more readily manufactured because material around the vias 104B may be more readily removed during planarization (through the "gaps" between adjacent shield portions 104).

Embodiments utilizing arcuate shield portions 104 may improve broadband and high-frequency narrowband performance relative to embodiments utilizing circular shield portions 104. In particular, reduced footprint area, improved impedance control (e.g., for broadband impedance matching among frequency-dependent antennas and vias), reduced loss, and/or improved crosstalk performance may be achieved.

The dimensions of the elements of the vertical shielded interconnect 100A may have any suitable values. For example, in some embodiments, a diameter 106 of the via 102B may be between 20 microns and 200 microns (e.g., between 20 microns and 50 microns, or approximately 35 microns). In some embodiments, a diameter of the pad 102A may be between 50 microns and 100 microns, or approximately 65 microns). In some embodiments, a diameter 108 of the collection of the shield portions 104 may be between 150 microns and 300 microns (e.g., between 200 microns and 300 microns, or approximately 250 microns).

FIG. 2 is a cross-sectional side view of another example of a vertical shielded interconnect 100A (sharing the same perspective as FIG. 1B). The vertical shielded interconnect 100A of FIG. 2 may include a signal portion 102 including multiple "stacked" pads 102A and vias 102B, and one or more shield portions 104 including multiple stacked pads 104A and vias 104B. The shield portions 104 may be coupled to a ground line or plane, or another suitable reference. A perspective view of the vertical shielded interconnect 100A of FIG. 2 may look like several of the vertical shielded interconnects 100A of FIG. 1A stacked on top of each other. Any suitable numbers of pads 102A and vias 102B may be stacked as part of a vertical shielded interconnect 100A (and similarly, any suitable numbers of pads 104A and vias 104B may be stacked) to form a vertical shielded interconnect 100A of a desired height. The elements of the vertical shielded interconnect 100A of FIG. 2 may take the form of any of the embodiments of the corresponding elements of the vertical shielded interconnect 100A of FIG. 1 (e.g., dimensions, shapes, etc.).

The embodiments of FIGS. 1-2 may be operated as coaxial interconnects. In the vertical shielded interconnects 100A discussed above with reference to FIGS. 1-2, a single signal portion 102 is located in the "interior" of a set of shield portions 104. In some variants of the vertical shielded interconnects 100A of FIGS. 1-2, multiple signal portions 102 may be located in the interior of a set of shield portions 104 to provide a twinaxial or multiaxial interconnect, as desired. The vertical shielded interconnects 100A may provide strong isolation and good signal fidelity during use.

Figure 3:
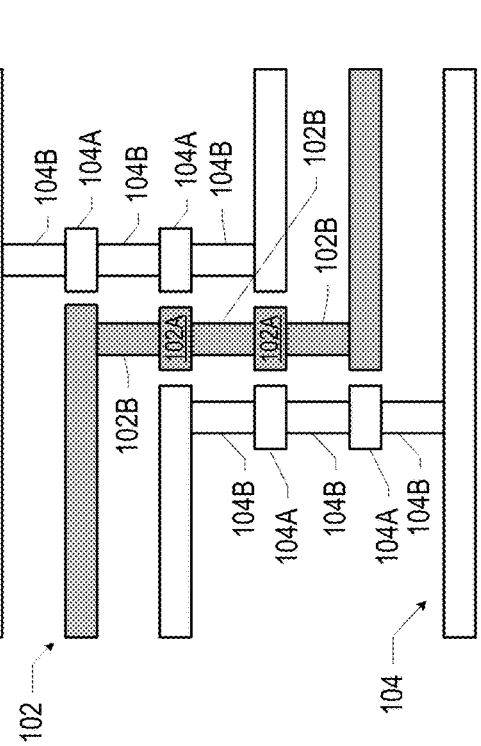

FIG. 3 is a cross-sectional side view of another example of a vertical shielded interconnect 100A (sharing the same perspective as FIGS. 1B and 2). The vertical shielded interconnect 100A of FIG. 3 may include a signal portion 102 including multiple "stacked" pads 102A and vias 102B, and one or more shield portions 104 including multiple stacked pads 104A and vias 104B. The shield portions 104 may be coupled to a ground line or plane, or another suitable reference. Dielectric material (not shown) may be disposed around the signal portion 102 and the shield portions 104. The vertical shielded interconnect 100A of FIG. 3 may be a transmission line structure that includes a stripline to vertical stripline transition, and a vertical stripline to stripline transition three layers down. During operation, a signal traveling through the vertical shielded interconnect 100A of FIG. 3 may encounter no discontinuity except a right-angle bend; the transmission line mode is unchanged. The vertical shielded interconnect 100A of FIG. 3 may thus exhibit a better-matched, broader-band, and lower-loss vertical routing solution than can be provided by conventional vias. Any suitable numbers of pads 102A and vias 102B may be stacked as part of a vertical shielded interconnect 100A (and similarly, any suitable numbers of pads 104A and vias 104B may be stacked) to form a vertical shielded interconnect 100A of a desired height. A vertical shielded interconnect 100A like the one of FIG. 3 may include stripline, grounded coplanar waveguide, and/or microstrip structures, as desired.

Figure 4:
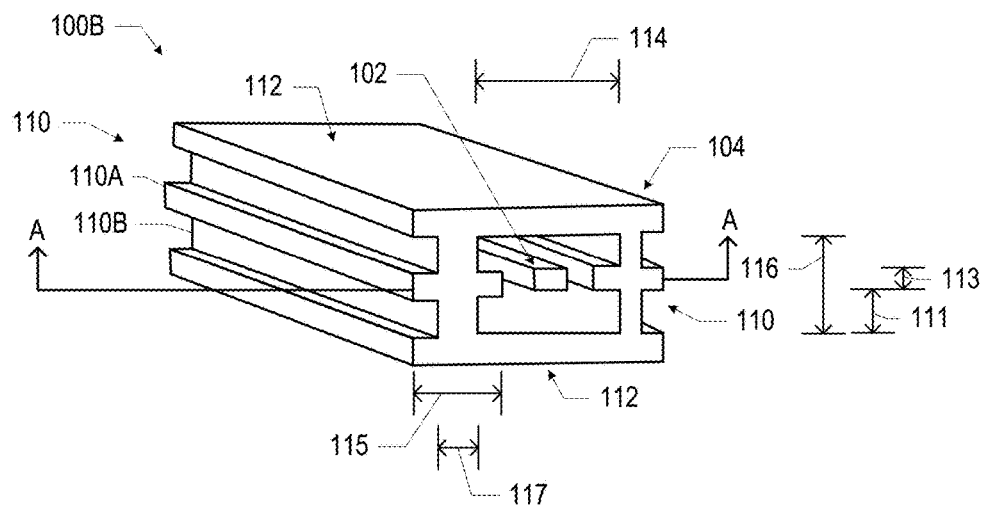
FIGS. 4-5 are various views of examples of horizontal shielded interconnects, in accordance with various embodiments.

FIG. 4 is a perspective view of a horizontal shielded interconnect 100B, in accordance with various embodiments. The horizontal shielded interconnect 100B of FIG. 2 may include a signal portion 102 (e.g., a transmission line) and a shield portion 104. A dielectric material (not shown) may surround the signal portion 102 in the interior of the shield portions 104. In FIG. 4, each signal portion 102 is illustrated as having a square cross-section, but this is simply an example, and any of the horizontal shielded interconnects 100B disclosed herein may have any suitable, manufacturable cross-section (e.g., rectangular, etc.). As discussed below, the shield portion 104 may provide a Faraday cage around the signal portion 102 of the horizontal shielded interconnect 100B, mitigating or eliminating electromagnetic interference and/or crosstalk (even when the pitch between adjacent signal portions 102 is reduced).

The shield portion 104 of the horizontal shielded interconnect 100B of FIG. 2 may include vertical walls 110 and horizontal walls 112. The vertical walls 110 may include a pad 110A and vias 1108 (e.g., patterned vias), while the horizontal walls 112 may be formed of pads or planar sheets. The vertical walls 110 and the horizontal walls 112 may be substantially "solid," providing a sleeve around the signal portion 102 (and improving performance relative to embodiments in which the vertical walls 110 include gaps or other openings). In particular, the vias 1108 may have rectangular footprints on the pads 110A (in contrast to structures in which "porous" vertical walls may be provided by distinct circular vias landing on pads). The signal portion 102 may be patterned simultaneously with the pad 110A of the vertical walls 110; in embodiments in which a vertical wall 110 includes multiple pads 110A (e.g., to achieve a desired height 116), signal portions 102 may be aligned with one or more of these pads 110A. Although a single signal portion 102 is illustrated in FIG. 4 (providing a coaxial interconnect, as discussed above), multiple signal portions 104 may be located "inside" a sleeve of a shield portion 104 (e.g., to provide a twinaxial or multiaxial interconnect).

The dimensions of the horizontal shielded interconnect 100B of FIG. 4 may take any suitable values (e.g., to achieve a desired transmission line impedance). For example, in some embodiments, the height 111 of a via 1108 may be between 10 microns and 50 microns (e.g., between 20 microns and 30 microns, or approximately 25 microns). In some embodiments, the height 113 of a pad 110A may be between 10 microns and 30 microns (e.g., between 10 microns and 20 microns, or approximately 15 microns). In some embodiments, the width 115 of a pad 110A may be between 25 microns and 100 microns (e.g., between 40 microns and 70 microns, or approximately 55 microns). In some embodiments, the width 115 of a pad 110A may be between 25 microns and 100 microns (e.g., between 40 microns and 70 microns, or approximately 55 microns). In some embodiments, the width 117 of a via 1108 may be between 10 microns and 50 microns (e.g., between 10 microns and 40 microns, or approximately 25 microns). In some embodiments, the maximum lateral width 114 of a sleeve (e.g., the maximum lateral distance between the vertical walls 110) may be between 25 microns and 500 microns. In some embodiments, the vertical height 116 of a sleeve (e.g., the distance between adjacent horizontal walls 112 of the shield portion 104) may be between 20 microns and 250 microns.

Figure 5:
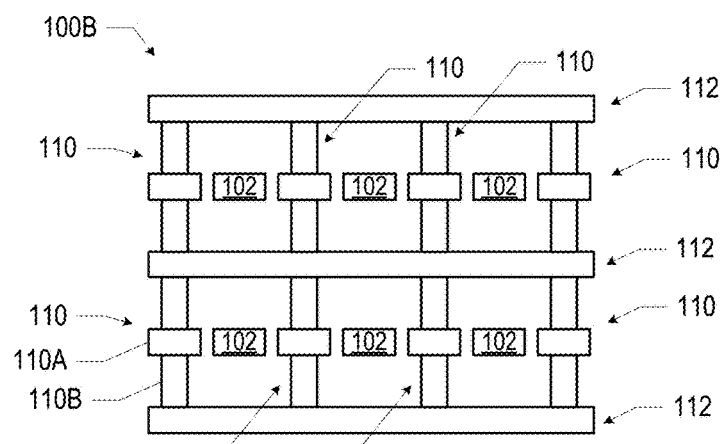

FIG. 5 is a cross-sectional side view of another example horizontal shielded interconnect 100B; the view of FIG. 5 may be analogous to a cross-sectional view through the section A-A of FIG. 4. The horizontal shielded interconnect 100B includes a shield portion 104 that is structured as an array of the shield portions 104 illustrated in FIG. 4, with multiple signal portions 102. In FIG. 5, the horizontal shielded interconnect 100B are shown as including two rows and three columns of signal portions 102, but any of the shielded interconnects 100B disclosed herein may include more or fewer rows and/or more or fewer columns of signal portions 102. The elements of the horizontal shielded interconnect 1008 of FIG. 5 may take the form of any of the embodiments of the corresponding elements of the horizontal shielded interconnect 1008 of FIG. 4 (e.g., dimensions, shapes, etc.).

Figure 6:
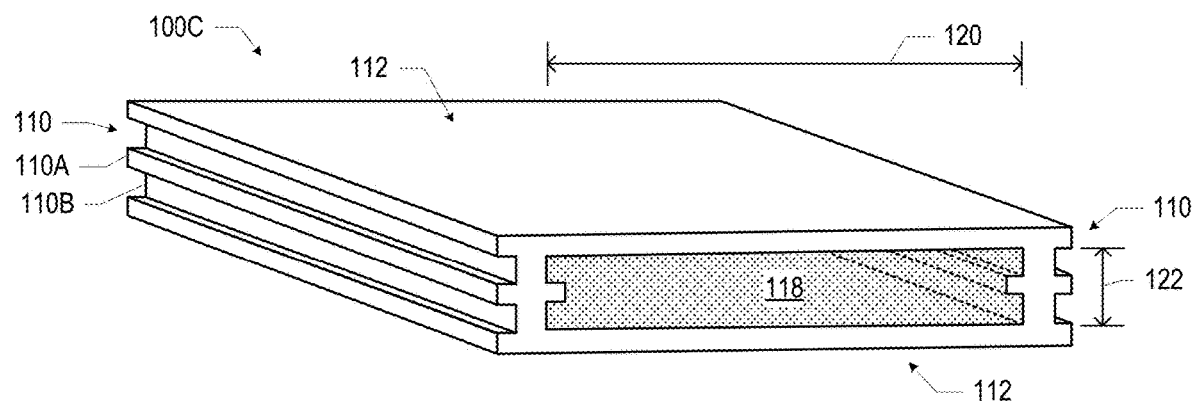
FIG. 6 is a perspective view of a waveguide, in accordance with various embodiments.

FIG. 6 is a perspective view of a waveguide 100C, in accordance with various embodiments. The waveguide 100C of FIG. 6 may include vertical walls 110 and horizontal walls 112. The vertical walls 110 may include a pad 110A and vias 1108 (e.g., patterned vias), while the horizontal walls 112 may be formed of pads or planar sheets. The vertical walls 110 and the horizontal walls 112 may be substantially "solid," enclosing an interior space through which electromagnetic waves may propagate. In some embodiments, a dielectric material 118 may be disposed in the interior of the waveguide 100C. Although the vertical walls 110 of FIG. 6 are shown as including only a single pad 110A, the vertical walls 110 may include multiple pads 110A (e.g., to achieve a desired height 122). In an IC assembly, the waveguide 100C may be located proximate to wave launchers or other structures that may send and receive electromagnetic waves that propagate through the waveguide 100C during operation.

The dimensions of the waveguide 100C may take any suitable values to achieve desired propagation characteristics. In some embodiments, the maximum lateral width 120 of the waveguide 100C (e.g., the maximum lateral distance between the vertical walls 110) may be between 0.5 millimeters and 5 millimeters (e.g., between 1 millimeter and 3 millimeters, or approximately 2 millimeters). In some embodiments, the vertical height 122 of a waveguide 100C (e.g., the distance between adjacent horizontal walls 112) may be between 20 microns and 250 microns (e.g., between 40 microns and 100 microns, or approximately 65 microns). In some embodiments, multiple waveguides 100C may be arranged in an array, analogous to the array of sleeves in the horizontal shielded interconnect 1008 of FIG. 5 (e.g., with multiple columns and/or rows of waveguides 100C) to provide a multi-channel waveguide 100C.

Figure 7:
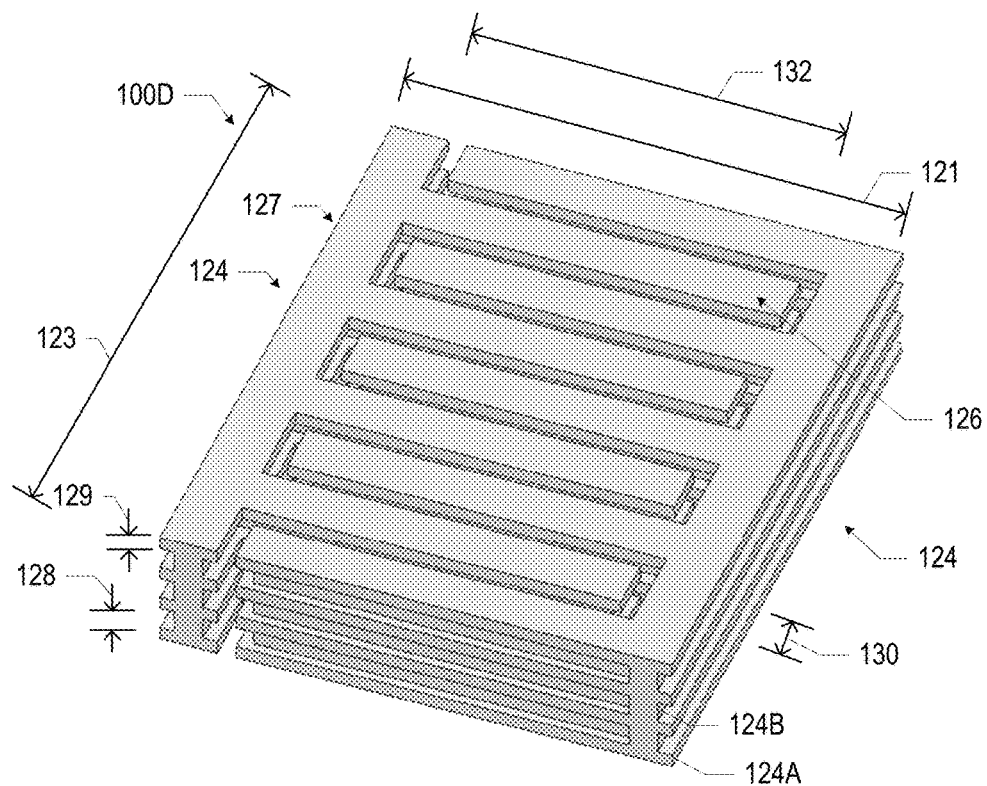
FIG. 7 is a perspective view of a capacitor, in accordance with various embodiments.

The IC structures 100 disclosed herein may include passive components that may be embedded in a package substrate; such passive components may impart performance advantages to an IC assembly, relative to the use of discrete passive components on a surface of a package substrate. For example, FIG. 7 is a perspective view of a capacitor 100D, in accordance with various embodiments. The capacitor 100D may include two or more conductive plates 124 spaced apart from each other to enable the storage of energy via the differential charge at the different conductive plates 124. A dielectric material (not shown) may be disposed between the conductive plates 124. Each of the conductive plates 124 may include multiple fingers 126 extending from a backbone 127, and the fingers 126 of one conductive plate 124 may be interdigitated with the fingers 126 of another conductive plate 124. The conductive plates 124 may include pads 124A and vias 1248 arranged in a stack; the pads 124A and the vias 1248 may be included in the fingers 126 of a conductive plate 124, as illustrated in FIG. 7. Although FIG. 7 depicts a particular number of conductive plates 124, pads 124A, vias 1248, and fingers 126, this is simply illustrative and a capacitor 100D may include any suitable number of conductive plates 124, pads 124A, vias 1248, and fingers 126 (e.g., conductive plates 124 having no vias 1248, and only a single planar layer of pads 124A).

The capacitor 100D may have any suitable dimensions. For example, in some embodiments, the height 128 of a via 1248 may be between 10 microns and 50 microns (e.g., between 20 microns and 30 microns, or approximately 25 microns). In some embodiments, the height 129 of a pad 124A may be between 10 microns and 30 microns (e.g., between 10 microns and 20 microns, or approximately 15 microns). In some embodiments, the width 130 of a finger 126 may be between 5 microns and 100 microns (e.g., between 10 microns and 60 microns, between 10 microns and 20 microns, between 50 microns and 60 microns, approximately 12 microns, or approximately 55 microns). In some embodiments, the length 132 of a finger 126 may be between 100 microns and 500 microns (e.g., between 200 microns and 500 microns, approximately 300 microns, or approximately 400 microns). In some embodiments, the length 123 of the capacitor 100D may be between 400 microns and 800 microns (e.g., between 500 microns and 700 microns, or approximately 650 microns). In some embodiments, the width 121 of the capacitor 100D may be between 300 microns and 800 microns (e.g., between 400 microns and 600 microns, or approximately 540 microns). The capacitance density of the capacitor 100D may depend on the dimensions of the capacitor 100D and its materials; for example, in some embodiments, the capacitance density of the capacitor 100D may be between 2.5 picofarads per square millimeter and 3 picofarads per square millimeter at 10 gigahertz. Increasing the height 128 may increase the capacitance of the capacitor 100D without increasing its footprint.

The capacitor 100D may have any of a number of advantages relative to conventional embedded capacitors, which may utilize conductive plates in different metal layers in the package substrate (separated by the substrate dielectric). The capacitance density of such conventional embedded capacitors may be limited by the dielectric constant of the substrate dielectric and minimum dielectric thickness. The capacitor 100D, interdigitated across multiple metal layers, may achieve higher capacitance values for the same spatial volume relative to conventional embedded capacitors.

Figure 8:
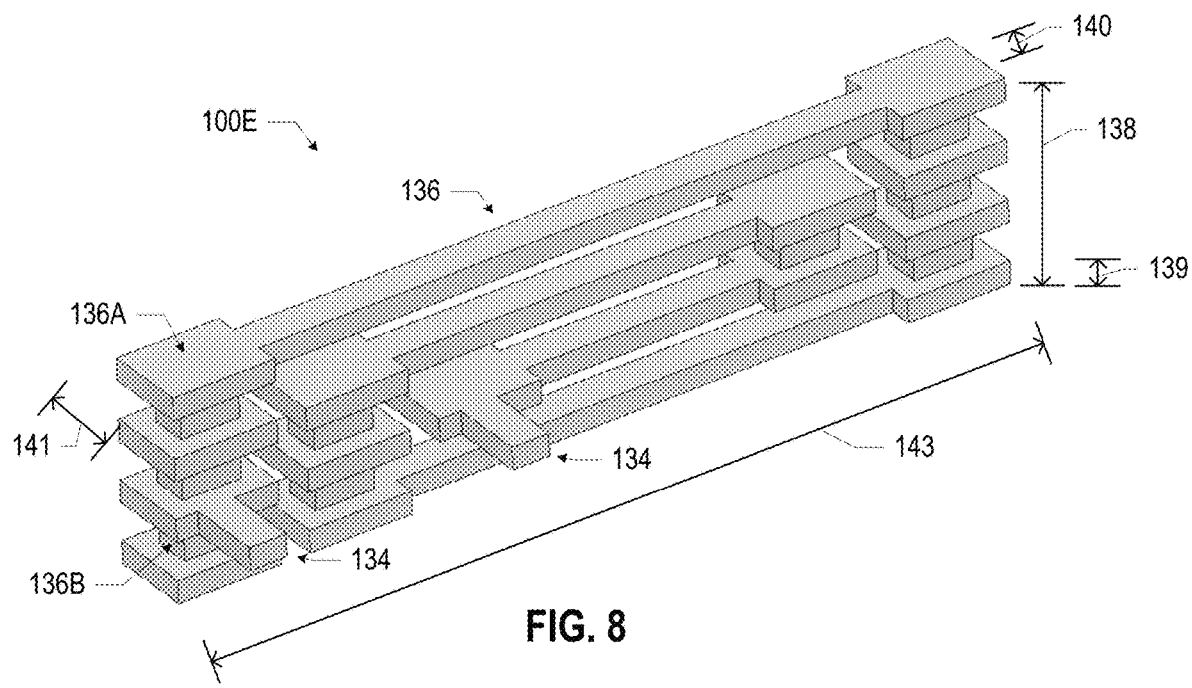
FIG. 8 is a perspective view of an inductor, in accordance with various embodiments.

FIG. 8 is a perspective view of an inductor 100E, in accordance with various embodiments. The inductor 100E may include two terminals 134 and a body portion 136 between the terminals 134. The body portion 136 may include any desired arrangement of loops or turns to achieve a desired inductance for the inductor 100E, and other circuitry (not shown) may be coupled to the terminals 134. A dielectric material (not shown) may be disposed around the inductor 100E. The body portion 136 may include pads 136A and vias 1368 to achieve a desired structure; the terminals 134 may themselves be pads 136A. Although FIG. 8 depicts a particular number and arrangement of pads 136A and vias 1368, this is simply illustrative and an inductor 100E may include any suitable number of pads 136A and vias 1368 in any suitable arrangement. Further, the footprint of the vias 1368 may have any suitable shape (e.g., rectangular, as illustrated in FIG. 8). Utilizing non-circular vias 1368 may enable increased density for vertically oriented inductors like the inductor 100E by reducing the dimension of the vias 1368 in the (horizontal) direction perpendicular to the inductor plane.

The inductor 100E may have any suitable dimensions. For example, in some embodiments, the length 143 of an inductor 100E may be between 200 microns and 900 microns (e.g., between 300 microns and 700 microns, between 500 microns and 700 microns, or approximately 600 microns). For example, in some embodiments, the height 138 of a via 136B may be between 10 microns and 50 microns (e.g., between 20 microns and 30 microns, or approximately 25 microns). In some embodiments, the height 139 of a pad 136A may be between 10 microns and 30 microns (e.g., between 10 microns and 20 microns, or approximately 15 microns). In some embodiments, the width 140 of a trace in the body portion 136 may be between 5 microns and 50 microns (e.g., between 20 microns and 40 microns, or approximately 25 microns). The width 141 of a pad 136A may be between 30 microns and 70 microns (e.g., between 40 microns and 60 microns, or approximately 55 microns). The inductance density of the inductor 100E may depend on the dimensions of the inductor 100E and its materials; for example, in some embodiments, the inductance density of the inductor 100E may be between 10 nanohenrys per square millimeter and 30 nanohenrys per square millimeter at 5 gigahertz.

Figure 9:
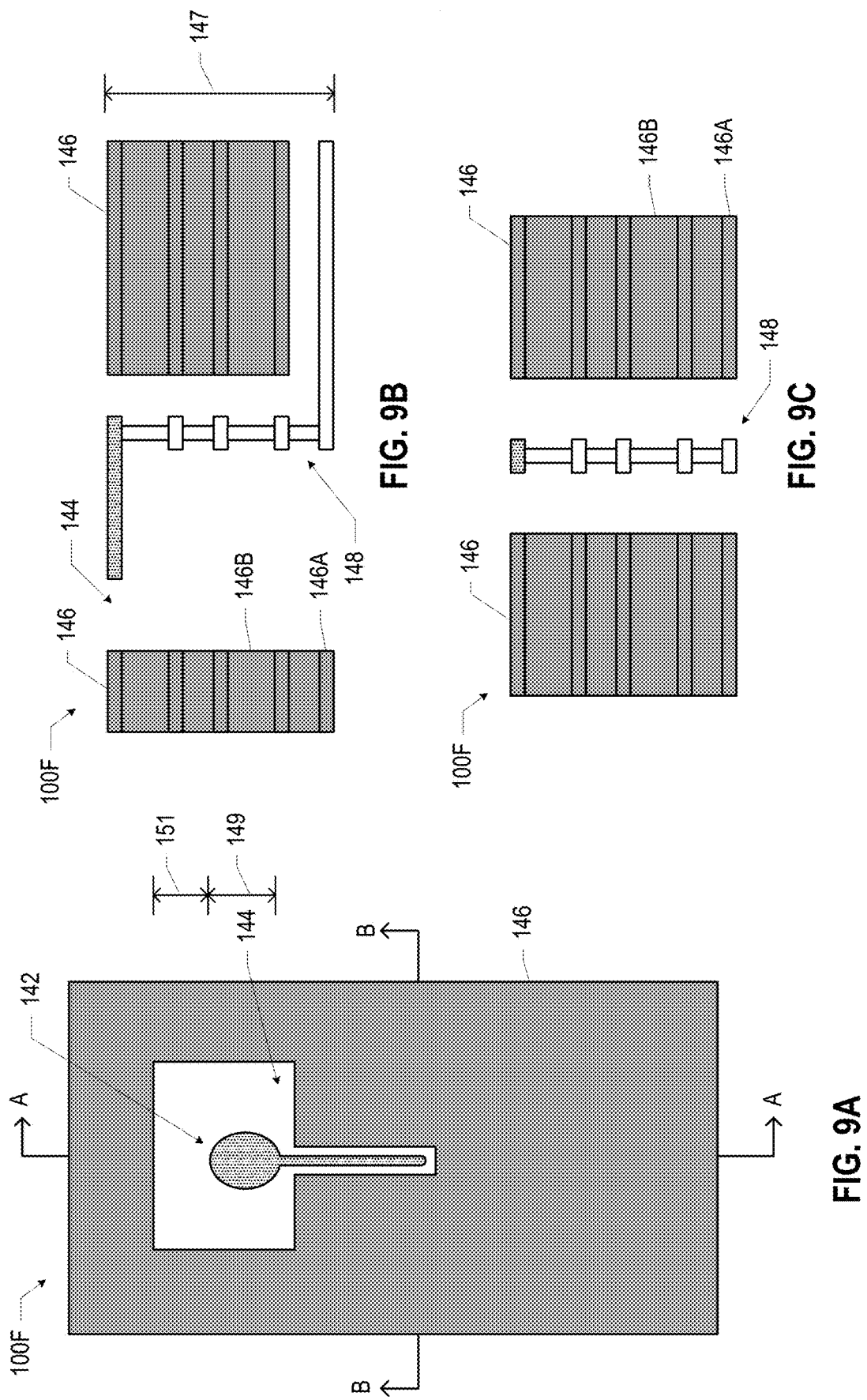
FIGS. 9A-9C are various views of an antenna structure, in accordance with various embodiments.

FIG. 9 illustrates an antenna structure 100F, in accordance with various embodiments. In particular, FIG. 9A is a top view of the antenna structure 100F, FIG. 9B is a cross-sectional side view of the antenna structure 100F through the cross-section A-A of FIG. 9A, and FIG. 9C is a cross-sectional side view of the antenna structure 100F through the cross-section B-B of FIG. 9A. The antenna structure 100F includes an antenna 142 in an opening 144 of a ground structure 146. The antenna 142 may be an elliptical monopole. The antenna 142 may be coupled to a coplanar waveguide feeding structure 148; the feeding structure 148 may include pads 148A and vias 148B. The ground structure 146 may include pads 146A and vias 146B to isolate the antenna 142 and the feeding structure 148. The opening 144 may extend to the bottom ground plane under the antenna 142 to improve the antenna impedance bandwidth.

The antenna structure 100F may be an ultra-wideband (UWB) antenna capable of operating at millimeter wave frequencies; in some embodiments, the antenna structure 100F may be included in a package substrate in a wireless communication device (e.g., a handheld computing device, a wireless router, or an access point) utilizing 5G communications technologies. The antenna structure 100F may also have lower cost, a smaller footprint, and/or a greater range of operating frequencies relative to conventional antennas. For example, in some embodiments, the antenna structure 100F may exhibit a return loss that is better than 10 decibels from 23 gigahertz to 75 gigahertz (with minor exceptions), indicating that the impedance bandwidth of the antenna structure 100F may be sufficient to cover the entire millimeter wave frequency range for 5G communications (above 20 gigahertz). In some embodiments, the antenna structure 100F may exhibit a peak realized gain higher than 3 decibels across the operating band.

The antenna structure 100F may have any suitable dimensions. In some embodiments, the height 147 of the antenna structure 100F may be less than 300 microns; this may represent a height reduction of more than 50% relative to conventional wideband patch antennas. In some embodiments, the longer dimension 149 of the antenna 142 may be between 0.8 millimeters and 2 millimeters (e.g., between 1 millimeter and 1.5 millimeters, or approximately 1.2 millimeters). In some embodiments, the gap 151 between the antenna 142 and the ground structure 146 may be between 0.8 millimeters and 1.2 millimeters (e.g., approximately 1 millimeter).

Figure 10:
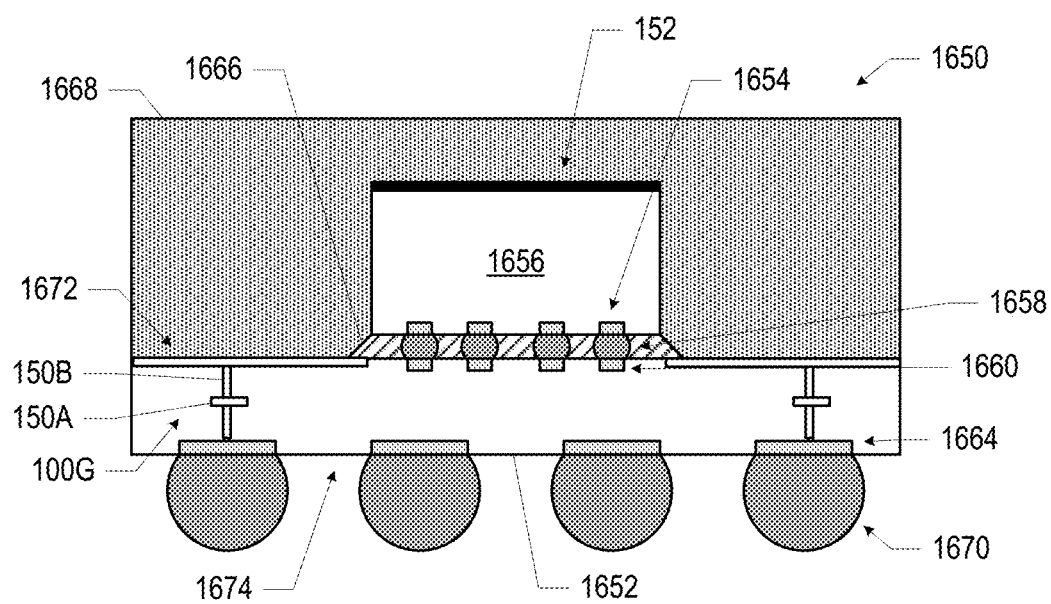
FIG. 10 is a cross-sectional side view of an integrated circuit (IC) package including a shielded package substrate, in accordance with various embodiments.

FIG. 10 illustrates an IC package 1650 including a shielded package substrate 1652. The shielded package substrate 1652 may include a package substrate shield structure 100G, which may include pads 150A and vias 1508 (e.g., patterned vias) arranged proximate to the lateral perimeter of the package substrate 1652 to provide a continuous ("solid") conductive wall around the package substrate 1652 to shield the interior of the package substrate 1652 from the outside environment. In some embodiments, the package substrate shield structure 100G may provide mechanical protection to the package substrate 1652 and/or may act as a hermetic seal for the edges of the package substrate 1652. In some embodiments, the topmost pad 150A may extend proximate to a face 1672 of the package substrate 1652, and close to or under a die 1656 coupled to the face 1672 of the package substrate 1652, providing a solid top layer ground plane. The die 1656 may have a conductive layer 152 disposed on its top face (so that the first-level interconnects 1658 coupling the die 1656 to the package substrate 1652 are between the conductive layer 152 and the face 1672); in some embodiments, the conductive layer 152 may be a conductive (e.g., metallic) ink printed on the die 1656. The conductive layer 152, and the package substrate shield structure 100G, may together provide an electromagnetic shield for the IC package 1650. Other elements of the IC package 1650 may take any of the forms discussed below with reference to FIG. 13.

In the embodiment of FIG. 10, the side faces of the die 1656 and the interface between the die 1656 and the package substrate 1652 may not be shielded; such an embodiment may be appropriate when little to no radiation is expected from these regions over the frequencies of interest. In other embodiments, the side faces of the die 1656 and the interface between the die 1656 and the package substrate 1652 may be shielded.

The IC package 1650 of FIG. 10, including the shielded package substrate 1652, may be more readily manufactured than some IC packages that are shielded using conventional techniques. For example, some conventional IC packages may be shielded by depositing a conformal layer of metal (e.g., by sputtering) over the entire complete IC package; such techniques require singulation of the package substrate and reconstitution on a carrier before the conformal layer may be deposited, and also require connecting the conformal layer with either an exposed grounded metal layer or second-level interconnects 1670 that are grounded. Using the package substrate shield structure 100G disclosed herein, as well as the conductive layer 152, the "Faraday cage" shielding for the package substrate 1652 may be "build into" the package substrate 1652 itself, allowing the IC package 1650 of FIG. 10 to be manufactured in strip or panel form before singulation (and without a subsequent metal deposition step). This improved manufacturing process may be more reliable, and less expensive, than conventional approaches.

The IC structures 100 disclosed herein may be included in any suitable electronic component. FIGS. 11-15 illustrate various examples of apparatuses that may include any of the IC structures 100 disclosed herein.

Figure 11:
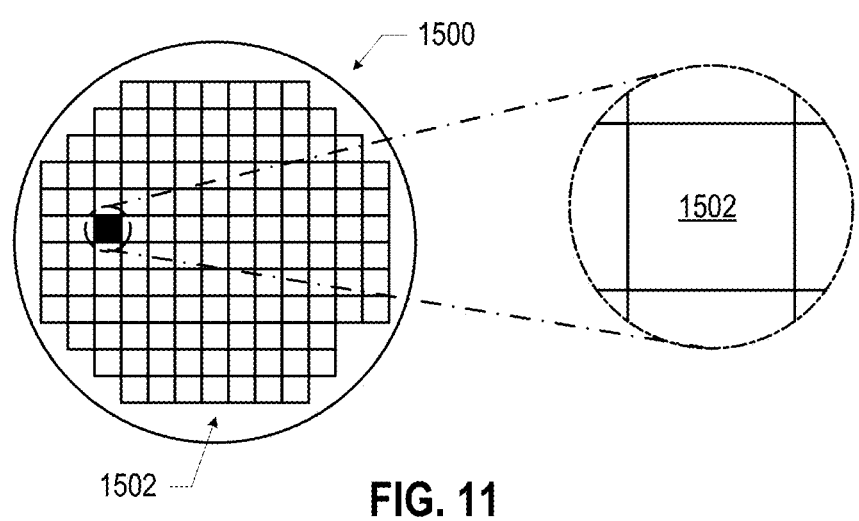
FIG. 11 is a top view of a wafer and dies that may be included in an IC package along with any of the IC structures disclosed herein.

FIG. 11 is a top view of a wafer 1500 and dies 1502 that may be included in an IC package whose substrate includes one or more of the IC structures 100 disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 12, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 15) or other logic that is configured to store information in the memory devices or execute instructions stored in the memory array.

Figure 12:
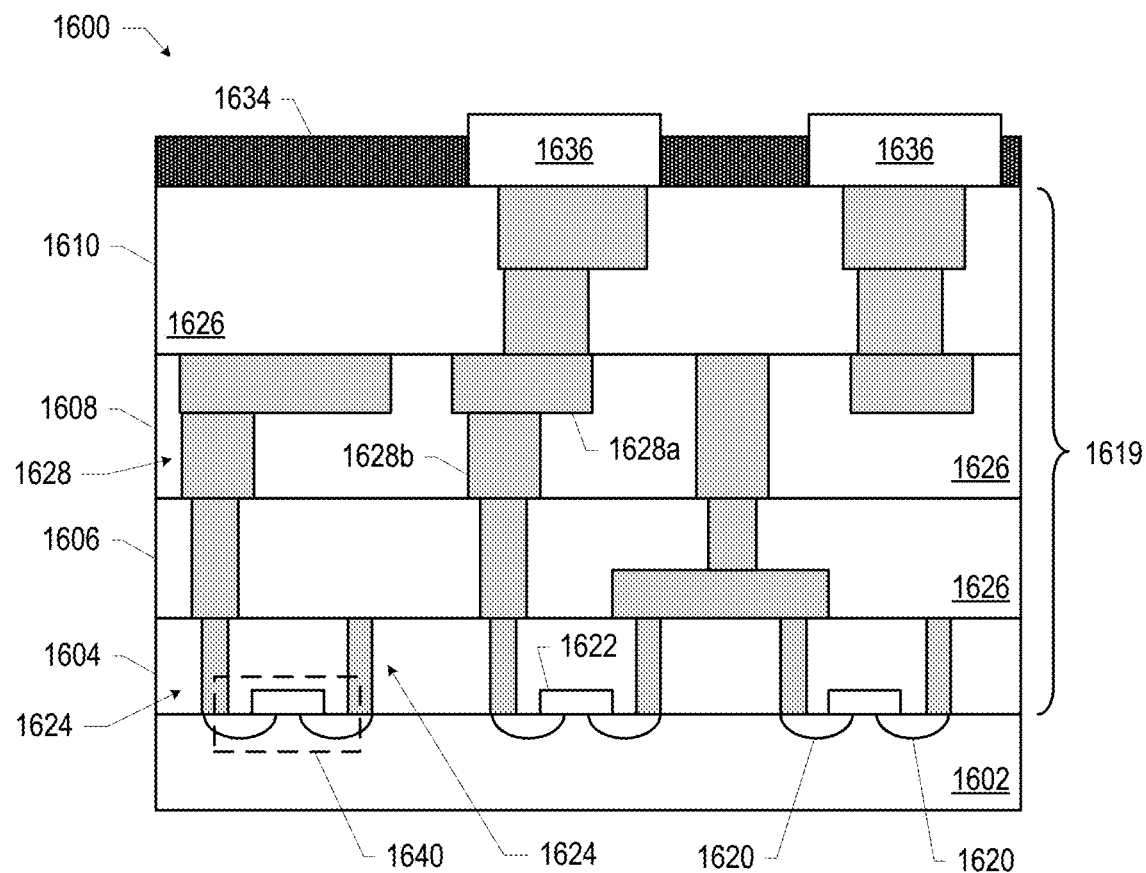
FIG. 12 is a cross-sectional side view of an IC device that may be included in an IC package along with any of the IC structures disclosed herein.

FIG. 12 is a cross-sectional side view of an IC device 1600 that may be included in an IC package whose substrate includes one or more of the IC structures 100 disclosed herein. One or more of the IC devices 1600 may be included in one or more dies 1502 (FIG. 11). The IC device 1600 may be formed on a substrate 1602 (e.g., the wafer 1500 of FIG. 11) and may be included in a die (e.g., the die 1502 of FIG. 11). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 11) or a wafer (e.g., the wafer 1500 of FIG. 11).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 12 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 12 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 12). Although a particular number of interconnect layers 1606-1610 is depicted in FIG. 12, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 12. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 12. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 12, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 13:
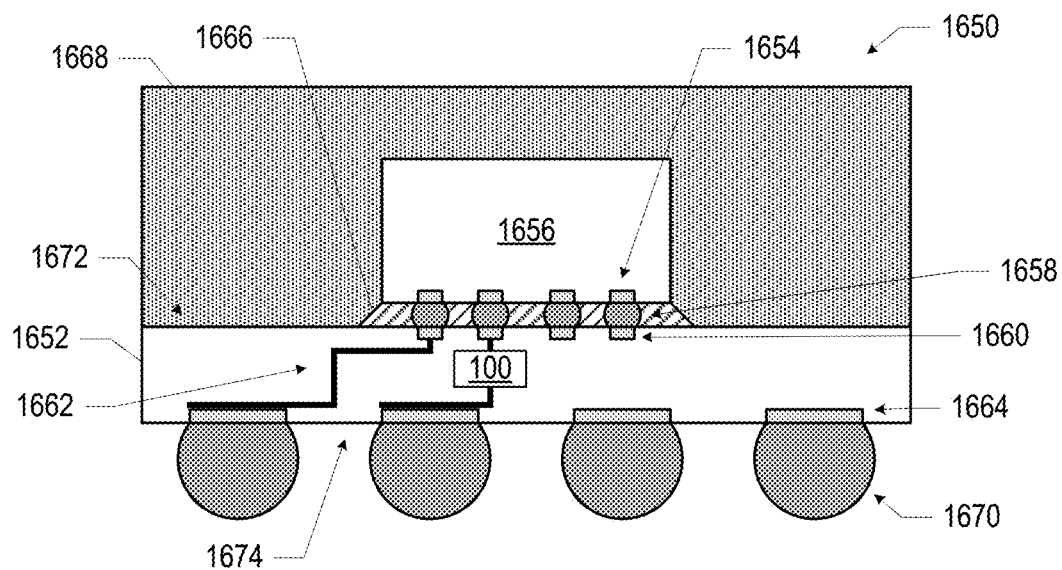
FIG. 13 is a cross-sectional side view of an IC package that may include any of the IC structures disclosed herein.

FIG. 13 is a cross-sectional view of an example IC package 1650 that may include one or more of the IC structures 100 disclosed herein. The package substrate 1652 may be formed of a dielectric material, and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 12. FIG. 13 illustrates a single IC structure 100 in the package substrate 1652, but this number and location of IC structures 100 in the IC package 1650 is simply illustrative, and any number of IC structures 100 (with any suitable structure) may be included in a package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 or to the IC structures 100 (or to other devices included in the package substrate 1652, not shown). The first-level interconnects 1658 illustrated in FIG. 13 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 13 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 14.

Although the IC package 1650 illustrated in FIG. 13 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 13, an IC package 1650 may include multiple dies 1656 (e.g., with one or more of the multiple dies 1656 coupled to IC structures 100 included in the package substrate 1652). An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 14:
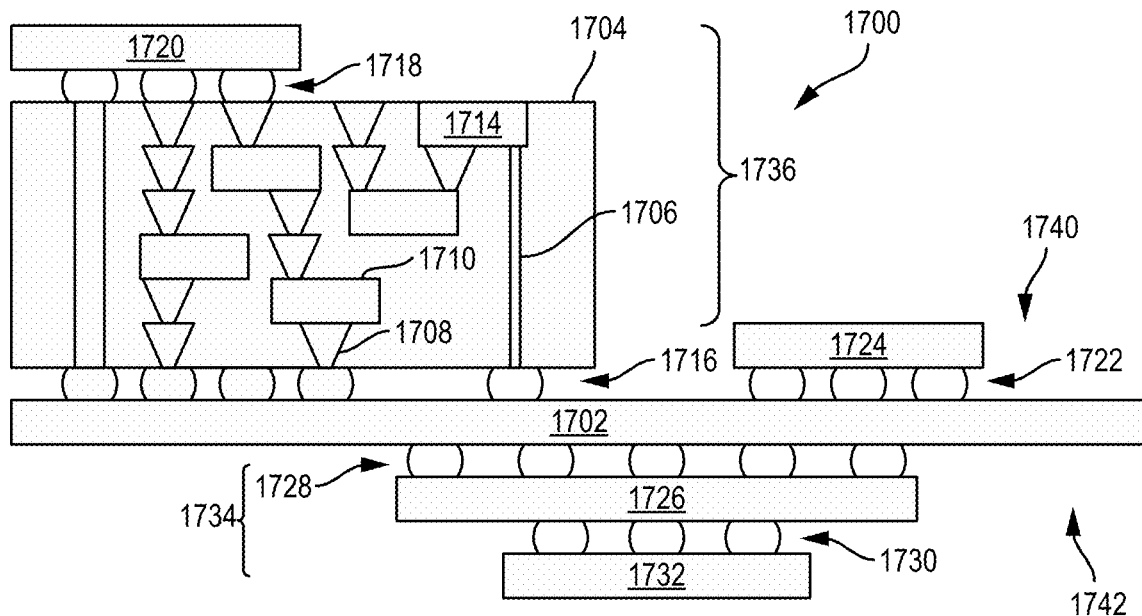
FIG. 14 is a cross-sectional side view of an IC device assembly that may include any of the IC structures disclosed herein.

FIG. 14 is a cross-sectional side view of an IC device assembly 1700 that may include one or more IC packages including one or more IC structures 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 13 (e.g., may include one or more IC structures 100 in a package substrate 1652).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 14 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 14), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 14, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 11), an IC device (e.g., the IC device 1600 of FIG. 12), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 14, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more IC structures 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 14 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 15:
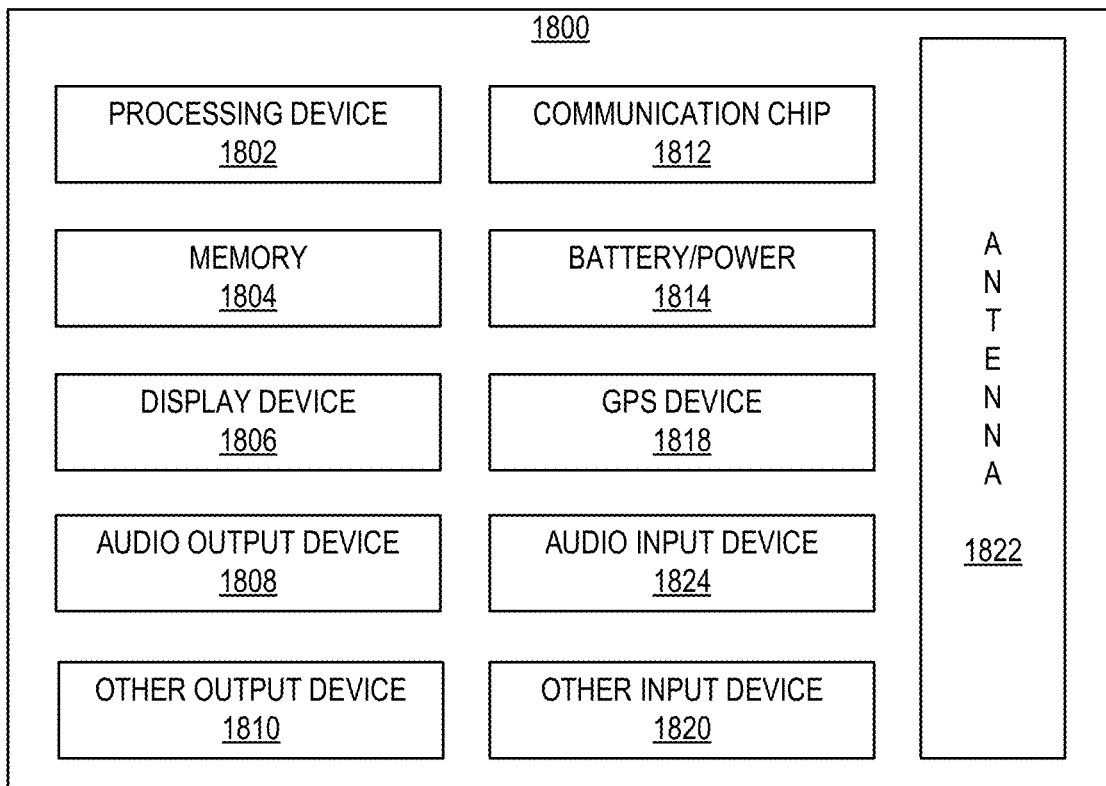
FIG. 15 is a block diagram of an example electrical device that may include any of the IC structures disclosed herein.

FIG. 15 is a block diagram of an example electrical device 1800 that may include one or more IC structures 100, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 15 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 15, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a vertical interconnect in an integrated circuit (IC) package substrate, including: a first conductive portion; and a plurality of second conductive portions arranged around the first conductive portion, wherein individual ones of the second conductive portions have an arcuate footprint.

Example 2 may include the subject matter of Example 1, and may further specify that the first conductive portion includes a pad and a via.

Example 3 may include the subject matter of Example 2, and may further specify that the pad and the via of the first conductive portion have circular footprints.

Example 4 may include the subject matter of any of Examples 1-3, and may further specify that individual ones of the second conductive portions include a pad and a via.

Example 5 may include the subject matter of Example 4, and may further specify that the pads and the vias of the second conductive portions have arcuate footprints.

Example 6 may include the subject matter of any of Examples 1-5, and may further specify that the first conductive portion includes multiple pads and multiple vias, and individual ones of the second conductive portions include multiple pads and multiple vias.

Example 7 may include the subject matter of any of Examples 1-6, and may further specify that the plurality of second conductive portions includes four conductive portions.

Example 8 may include the subject matter of any of Examples 1-7, and may further specify that an outer diameter of the vertical interconnect is between 200 microns and 300 microns.

Example 9 may include the subject matter of any of Examples 1-8, and may further specify that the plurality of second conductive portions are electrically coupled to a ground plane in the IC package substrate.

Example 10 is a conductive structure in an integrated circuit (IC) package substrate, including: two vertical conductive walls, wherein the two vertical conductive walls each include at least one via and at least one pad, and the at least one via has a rectangular footprint; and two horizontal conductive walls, wherein the two vertical conductive walls are in conductive contact with the two horizontal conductive walls.

Example 11 may include the subject matter of Example 10, and may further include: a conductive portion, wherein the conductive portion is between the two vertical conductive walls and between the two horizontal conductive walls.

Example 12 may include the subject matter of Example 11, and may further specify that the conductive portion is between corresponding pads of the two vertical conductive walls.

Example 13 may include the subject matter of Example 11, and may further specify that the conductive portion is one of a plurality of conductive portions arranged in an array, and the two vertical conductive walls are two of a plurality of vertical conductive walls arranged with a conductive portion between adjacent ones of the vertical conductive walls.

Example 14 may include the subject matter of any of Examples 10-13, and may further include: a dielectric material between the vertical conductive walls.

Example 15 may include the subject matter of any of Examples 10-14, and may further specify that the at least one via has a width between 10 microns and 50 microns.

Example 16 may include the subject matter of any of Examples 10-15, and may further specify that the vertical conductive walls and the horizontal conductive walls are electrically coupled to a ground plane in the IC package substrate.

Example 17 may include the subject matter of any of Examples 10-16, and may further specify that the conductive structure is a waveguide.

Example 18 is a vertical interconnect in an integrated circuit (IC) package substrate, including: a first conductive portion, wherein the first conductive portion includes at least one pad and at least one via, and the at least one via has a non-circular footprint; and a plurality of second conductive portions arranged around the first conductive portion.

Example 19 may include the subject matter of Example 18, and may further specify that individual ones of the second conductive portions include at least one pad and at least one via.

Example 20 may include the subject matter of any of Examples 18-19, and may further specify that the vertical interconnect structure includes a stripline, a microstripline, or a grounded coplanar waveguide.

Example 21 may include the subject matter of any of Examples 18-20, and may further specify that the second conductive portions are electrically coupled to a ground plane in the IC package substrate.

Example 22 may include the subject matter of any of Examples 18-21, and may further specify that the first conductive portion includes at least two right-angle transitions.

Example 23 is a passive component in an integrated circuit (IC) package substrate, including: at least one non-circular via; and at least one pad in contact with the at least one non-circular via; wherein the passive component includes an inductor or a capacitor.

Example 24 may include the subject matter of Example 23, and may further specify that the passive component includes a capacitor.

Example 25 may include the subject matter of Example 24, and may further specify that the at least one pad includes a plurality of fingers extending from a backbone.

Example 26 may include the subject matter of Example 25, and may further specify that the capacitor includes at least two pads having a plurality of fingers extending from a backbone, and the fingers of the two pads are interdigitated.

Example 27 may include the subject matter of any of Examples 23-26, and may further specify that the at least one via includes a plurality of fingers extending from a backbone.

Example 28 may include the subject matter of Example 27, and may further specify that the capacitor includes at least two vias having a plurality of fingers extending from a backbone, and the fingers of the two vias are interdigitated.

Example 29 may include the subject matter of any of Examples 23-28, and may further specify that the passive component includes an inductor.

Example 30 may include the subject matter of Example 29, and may further specify that the inductor includes at least three pads.

Example 31 may include the subject matter of any of Examples 29-30, and may further specify that the at least one non-circular via has a rectangular footprint.

Example 32 may include the subject matter of any of Examples 29-31, and may further specify that the pad has a width between 25 microns and 100 microns.

Example 33 is an integrated circuit (IC) package, including: a package substrate; and a die coupled to the package substrate; wherein the package substrate includes a shield structure, wherein the shield structure includes at least one via and at least one pad arranged to provide solid walls of conductive material proximate to edges of the package substrate.

Example 34 may include the subject matter of Example 33, and may further specify that the shield structure includes a top metal plane having an opening under the die.

Example 35 may include the subject matter of any of Examples 33-34, and may further include: a metal layer on the die, wherein the die is between the metal layer and the package substrate.

Example 36 may include the subject matter of Example 35, and may further specify that the metal layer does not extend onto side faces of the die.

Example 37 may include the subject matter of any of Examples 33-35, and may further include: a mold material above the die and the package substrate.

Example 38 is an antenna structure in an integrated circuit (IC) package substrate, including: a top metal layer including an antenna and a ground plane having an opening into which the antenna extends; a feeding structure coupled to the antenna, wherein the feeding structure includes at least one via; and a bottom metal layer, wherein the bottom metal layer includes at least a portion of the feeding structure and the opening extends into the bottom metal layer.

Example 39 may include the subject matter of Example 38, and may further specify that the antenna has an elliptical portion.

Example 40 may include the subject matter of Example 39, and may further specify that a major axis of the elliptical portion has a length between 1 millimeter and 2 millimeters.

Example 41 may include the subject matter of any of Examples 39-40, and may further specify that the bottom metal layer includes a ground plane coupled to the ground plane of the top metal layer by vias and pads.

Example 42 may include the subject matter of Example 41, and may further specify that the vias are non-circular.

The invention claimed is:

1. A conductive structure in an integrated circuit (IC) package substrate, comprising:
   two vertical conductive walls, wherein the two vertical conductive walls each include at least one via and at least one pad, the vias and pads of an individual vertical conductive wall are distributed in a vertical direction relative to each other, and the at least one via has a rectangular footprint;
   two horizontal conductive walls, wherein the two vertical conductive walls are both in conductive contact with the two horizontal conductive walls; and
   a conductive portion, wherein the conductive portion is between the two vertical conductive walls and between the two horizontal conductive walls, and the conductive portion and the horizontal conductive walls are distributed in a vertical direction relative to each other.

2. The conductive structure of claim 1, wherein the conductive portion is between corresponding pads of the two vertical conductive walls.

3. The conductive structure of claim 1, wherein the conductive portion is one of a plurality of conductive portions arranged in an array, and the two vertical conductive walls are two of a plurality of vertical conductive walls arranged with a conductive portion between adjacent ones of the vertical conductive walls.

4. The conductive structure of claim 1, further comprising:
   a dielectric material between the vertical conductive walls.

5. The conductive structure of claim 1, wherein the conductive structure is a waveguide.

6. The conductive structure of claim 1, wherein individual ones of the horizontal conductive walls are planar.

7. The conductive structure of claim 1, wherein individual ones of the horizontal conductive walls have rectangular footprints.

8. A passive component in an integrated circuit (IC) package substrate, comprising:
   at least one non-circular via; and
   at least one pad in contact with the at least one non-circular via;
   wherein the passive component includes an inductor or a capacitor, the passive component includes at least two vias having a plurality of fingers extending from a backbone, and the fingers of the two vias are interdigitated.

9. The passive component of claim 8, wherein the passive component includes a capacitor.

10. The passive component of claim 8, wherein the passive component includes an inductor.

11. The passive component of claim 10, wherein the at least one non-circular via has a rectangular footprint.

12. The passive component of claim 10, wherein the pad has a width between 25 microns and 100 microns.

13. An electrical device, comprising:
   a package substrate; and
   a die coupled to the package substrate;
   wherein the package substrate includes two vertical conductive walls, the two vertical conductive walls each include at least one via and at least one pad, the vias and pads of an individual vertical conductive wall are distributed in a vertical direction relative to each other;
   two horizontal conductive walls, wherein the two vertical conductive walls are both in conductive contact with the two horizontal conductive walls; and a conductive portion, wherein the conductive portion is between the two vertical conductive walls and between the two horizontal conductive walls, the conductive portion has a longitudinal axis along which the conductive portion extends, and the longitudinal axis is perpendicular to the vertical direction.

14. The electrical device of claim 13, wherein the longitudinal axis of the conductive portion is coplanar with at least one pad of a vertical conductive wall.

15. The electrical device of claim 13, wherein the conductive portion and the horizontal conductive walls are distributed in a vertical direction relative to each other.

16. The electrical device of claim 13, further comprising:
an element electrically coupled to the package substrate, wherein the element includes a circuit board or an antenna.

17. An electrical device, comprising:
a package substrate; and
a die coupled to the package substrate;
wherein the package substrate includes a passive component, the passive component includes an inductor or a capacitor, the passive component includes at least two vias having a plurality of fingers extending from a backbone, and the fingers of the two vias are interdigitated.

18. The electrical device of claim 17, wherein the passive component includes a capacitor.

19. The electrical device of claim 17, wherein the passive component includes a capacitor.

20. The electrical device of claim 17, wherein the electrical device is a handheld communication device or a wearable communication device.

21. The electrical device of claim 17, wherein the electrical device includes a touchscreen.

* * * * *